(12) United States Patent
Kono et al.

(10) Patent No.: US 8,475,724 B2
(45) Date of Patent: Jul. 2, 2013

(54) METHOD AND APPARATUS FOR PLASMA-TREATING POROUS BODY

(75) Inventors: Koichi Kono, Asaka (JP); Kotaro Kimishima, Yokohama (JP); Kazuki Kiso, Nasushiobara (JP)

(73) Assignee: Toray Battery Separator Film Co., Ltd, Tochigi (JP)

( * ) Notice: Subject to any disclaimer, the term of this patent is extended or adjusted under 35 U.S.C. 154(b) by 1512 days.

(21) Appl. No.: 12/066,447

(22) PCT Filed: Sep. 11, 2006

(86) PCT No.: PCT/JP2006/318004
§ 371 (c)(1),
(2), (4) Date: Mar. 11, 2008

(87) PCT Pub. No.: WO2007/032321
PCT Pub. Date: Mar. 22, 2007

(65) Prior Publication Data
US 2009/0277776 A1    Nov. 12, 2009

(30) Foreign Application Priority Data

Sep. 12, 2005 (JP) .................................. 2005-264269

(51) Int. Cl.
*B01J 19/08* (2006.01)
*H05H 1/24* (2006.01)

(52) U.S. Cl.
USPC .................................................. 422/186.05

(58) Field of Classification Search
USPC .................................................. 422/186.05
See application file for complete search history.

(56) References Cited

U.S. PATENT DOCUMENTS

| | | | |
|---|---|---|---|
| 4,107,049 A * | 8/1978 | Sano et al. | 210/490 |
| 4,840,636 A * | 6/1989 | Bauser et al. | 8/115.52 |
| 5,110,619 A | 5/1992 | Ogumi et al. | |
| 2001/0031234 A1 | 10/2001 | Christodoulatos et al. | |
| 2003/0052096 A1 | 3/2003 | Crowe et al. | |
| 2004/0037756 A1 | 2/2004 | Houston, Jr. et al. | |
| 2005/0238818 A1 | 10/2005 | Yoshizawa | |

FOREIGN PATENT DOCUMENTS

| | | |
|---|---|---|
| DE | 44 32 919 A1 | 1/1996 |
| JP | 2-232373 A | 9/1990 |
| JP | 08-337676 | 12/1996 |
| JP | 08-337676 A | 12/1996 |
| JP | 8-337767 A | 12/1996 |
| JP | 2003-142415 A | 5/2003 |
| JP | 2005-203166 A | 7/2005 |

OTHER PUBLICATIONS

Chinese Office Action in corresponding Chinese Application No. 200680033323.4 dated Nov. 16, 2010.

(Continued)

*Primary Examiner* — Kishor Mayekar
(74) *Attorney, Agent, or Firm* — Sughrue Mion, PLLC

(57) ABSTRACT

A method for plasma-treating a porous body, comprising the steps of generating plasma using an inert gas or a mixed gas of an inert gas and a reactive gas, (a) blowing the resultant plasma gas to the porous body at a flow rate per a unit area of the porous body of 0.002 to 2 L/minute/$cm^2$, (b) sucking the porous body in a plasma gas atmosphere, or (c) sucking the porous body while blowing the plasma gas to the porous body at said flow rate, thereby treating the plasma the surfaces and pores of said porous body with plasma.

2 Claims, 8 Drawing Sheets

OTHER PUBLICATIONS

European Search Report for corresponding Application No. 06 79 7811, dated Jan. 14, 2011.

Japanese Office Action dated May 11, 2011, issued in Japanese Patent Application No. 2005-264269.

* cited by examiner

METHOD AND APPARATUS FOR PLASMA-TREATING POROUS BODY

FIELD OF THE INVENTION

This invention relates to a method and an apparatus for plasma-treating a porous body, particularly to a method and an apparatus for plasma-treating the surfaces and pores of a porous plastic film.

BACKGROUND OF THE INVENTION

Plasma treatment is conducted to hydrophilize hydrophobic materials such as plastics, glass, ceramics, metals, semiconductors, etc. For instance, U.S. Pat. No. 5,543,017 discloses a method for plasma-treating a plastic material by glow discharge at an atmospheric pressure, comprising placing a plastic material between a pair of electrodes, at least one of which is insulated, in a plasma reactor; introducing a mixture of (a) argon, an argon-helium mixed gas or an argon-hydrogen mixed gas, and (b) about 18% of saturated steam or a steam-ketone mixed gas at a predetermined temperature into the plasma reactor, and applying a high-frequency voltage to cause glow discharge at an atmospheric pressure, thereby generating plasma.

JP 11-128634 A discloses a method for hydrophilizing a hydrophobic, non-woven fabric without damage, comprising disposing the non-woven fabric between a pair of dielectric-body-covered electrode pipes, and generating plasma between the electrode pipes in a mixed gas atmosphere containing an inert gas.

U.S. Pat. No. 6,399,159 discloses a method for effectively plasma-treating a polyolefin-coated web, comprising (a) supplying a gas to a treatment zone, (b) applying high voltage having a frequency of $1/t_c$ to 2 MHz to a treatment electrode or its opposing electrode, wherein $t_c$ is a charging time in which a web surface is exposed to ion current in plasma, to generate plasma in the treatment zone, (c) passing the above web in the treatment zone, and (d) generating reactive species on the polyolefin coating on the above web by the treating gas.

The Research Report No. 3 (2000) of the Tokyo Metropolitan Industrial Technology Research Institute discloses a method for imparting durable hydrophilicity to polyethylene (PE) or polypropylene (PP), comprising placing a sample on a lower one of a pair of electrode plates, causing high-frequency glow discharge in an oxygen atmosphere, treating a plate of PE or PP with oxygen plasma, and treating it with a polar solvent. However, any method of the above references fails to plasma-treat a porous body to its pores.

U.S. Pat. No. 5,403,453 discloses a method of generating durable, uniform glow discharge plasma between a pair of electrodes in a gas kept at an atmospheric pressure, placing a polymer membrane such as a non-woven fabric, etc. in that atmosphere for a certain period of time, forming reactive species while controlling the pressure in a chamber by bellows or a piston, and passing the reactive species through the polymer membrane. Even by this method, however, it is difficult to plasma-treat pores of several μm in a microporous thermoplastic resin membrane.

JP 2003-7497 A discloses an atmospheric-pressure-plasma-treating apparatus comprising a columnar, high-voltage electrode, and a hollow cylindrical ground electrode disposed around the columnar, high-voltage electrode via a cylindrical insulating body, the high-voltage, columnar electrode having pluralities of straight grooves longitudinally extending on its peripheral surface to a tip end of the electrode, and the straight grooves being covered with the cylindrical insulating body to provide gas paths acting as a discharge gap. In this atmospheric-pressure-plasma-treating apparatus, a gas at an atmospheric pressure is introduced into the gas paths, and a high-frequency voltage is applied to both electrodes to generate glow discharge plasma. The resultant plasma gas is ejected from pluralities of exits at the tip end of the electrode (ends of the gas paths), so that only a necessary portion of a work can be treated in a pinpoint manner. However, it is difficult to efficiently plasma-treat the pores of a porous sheet having a large area by this apparatus.

OBJECT OF THE INVENTION

Accordingly, an object of this invention is to provide a method and an apparatus for plasma-treating the surfaces and pores of a porous body efficiently.

DISCLOSURE OF THE INVENTION

As a result of intense research in view of the above object, the inventors have found that the surfaces and pores of a porous body can be plasma-treated efficiently, by (a) blowing a plasma gas at a desired flow rate to the porous body, or (b) sucking the porous body in a plasma gas atmosphere. This invention has been completed based on such finding.

Thus, the method of this invention for plasma-treating a porous body comprises the steps of generating plasma using an inert gas or a mixed gas of an inert gas and a reactive gas, (a) blowing the resultant plasma gas to the porous body at a flow rate per a unit area of the porous body of 0.002 to 2 L/minute/cm$^2$, (b) sucking the porous body in a plasma gas atmosphere, or (c) sucking the porous body while blowing the plasma gas to the porous body at the above flow rate, thereby causing the plasma gas to pass through said porous body. This method is suitable for the plasma treatment of a porous plastic film, particularly a microporous polyolefin membrane.

For more efficient plasma treatment of the porous body, the plasma-treating method of this invention preferably meets the following conditions.

(1) The amount of the plasma gas blown to the above porous body is preferably 0.02 to 1.2 L/minute/cm$^2$ per a unit area of the porous body.

(2) The pressure of a plasma gas flow blown to the above porous body is preferably 1 to 100 Pa.

(3) The sucking pressure of the above porous body is preferably 1 to 100 Pa.

(4) It is preferable to suck the above porous body in contact with the porous support, while (a) blowing a plasma gas at a flow rate 0.002 to 2 L/minute/cm$^2$ to the above porous body, (b) sucking the above porous support, (c) sucking the above porous support while blowing the plasma gas to the above porous body at a flow rate of 0.002 to 2 L/minute/cm$^2$, or (d) blowing the plasma gas to the above porous support.

(5) The porous support described in (4) above preferably has a porosity of 20 to 80%.

(6) The porous support described in (4) or (5) above is preferably in the form of a plate or a roll.

(7) It is preferable to plasma-treat the above porous body by a batch method using the planar, porous support described in (6) above, or to continuously plasma-treat the above porous body conveyed by a roll-shaped, porous support described in (6) above.

(8) In the plasma-treating method described in any one of (4) to (7) above, the above porous body and the above porous support are preferably disposed outside a plasma-gas-generating region between the high-voltage electrode and the ground electrode of the plasma-gas-generating means.

(9) In the plasma-treating method described in any one of (4) to (7) above, the above porous support preferably constitutes the ground electrode of the plasma-gas-generating means, to plasma-treat the above porous body in contact with the ground electrode (porous support).

(10) In the plasma-treating method described in any one of (4) to (7) above, it is preferable to use two plasma-gas-generating means, a ground electrode of one generating means being constituted by the above porous support to treat the above porous body in a plasma-gas-generating region, and another generating means blowing a plasma gas to the above porous support.

The first apparatus of this invention for plasma-treating a porous body in a chamber comprises a plasma-gas-generating means, a pipe for supplying a plasma-generating gas, which is an inert gas or a mixed gas of an inert gas and a reactive gas, to the generating means, and a porous support contained in the chamber, the porous support being disposed at such a position that it receives pressure from a plasma gas flow supplied from the generating means, and the pressure of the plasma gas flow being applied to the porous body or the porous support, with the porous body in contact with the porous support. This apparatus preferably further comprises a means for sucking the porous body or the porous support for more efficient treatment.

The second apparatus of this invention for plasma-treating a porous body in a chamber comprises a plasma-gas-generating means, and a pipe for supplying a plasma-generating gas, which is an inert gas or a mixed gas of an inert gas and a reactive gas, to the generating means, the generating means comprising a high-voltage electrode and a porous ground electrode, the porous ground electrode acting as a support for the porous body being a porous metal which is or is not covered with a porous dielectric body, the apparatus comprising a means for sucking the porous ground electrode, and the generating means generating a plasma gas while the porous ground electrode in contact with the porous body is sucked.

The third apparatus of this invention for plasma-treating a porous body in a chamber comprises a plasma-gas-generating means, and a pipe for supplying a plasma-generating gas, which is an inert gas or a mixed gas of an inert gas and a reactive gas, to the generating means, the generating means comprising a high-voltage electrode and a porous ground electrode, the porous ground electrode acting as a support for the porous body being a porous metal which is or is not covered with a porous dielectric body, and the generating means generating a plasma gas while the plasma-generating gas is supplied to the porous ground electrode in contact with the porous body.

The fourth apparatus of this invention for plasma-treating a porous body in a chamber comprises first and second plasma-gas-generating means, and a pipe for supplying a plasma-generating gas, which is an inert gas or a mixed gas of an inert gas and a reactive gas, to each generating means, the first generating means comprising a high-voltage electrode and a porous ground electrode, the porous ground electrode acting as a support for the porous body being a porous metal which is or is not covered with a porous dielectric body, and the first generating means generating a plasma gas while the second generating means blows a plasma gas to the porous ground electrode in contact with the porous body.

DESCRIPTION OF THE PREFERRED EMBODIMENTS

[1] Porous Body

Figure 1:
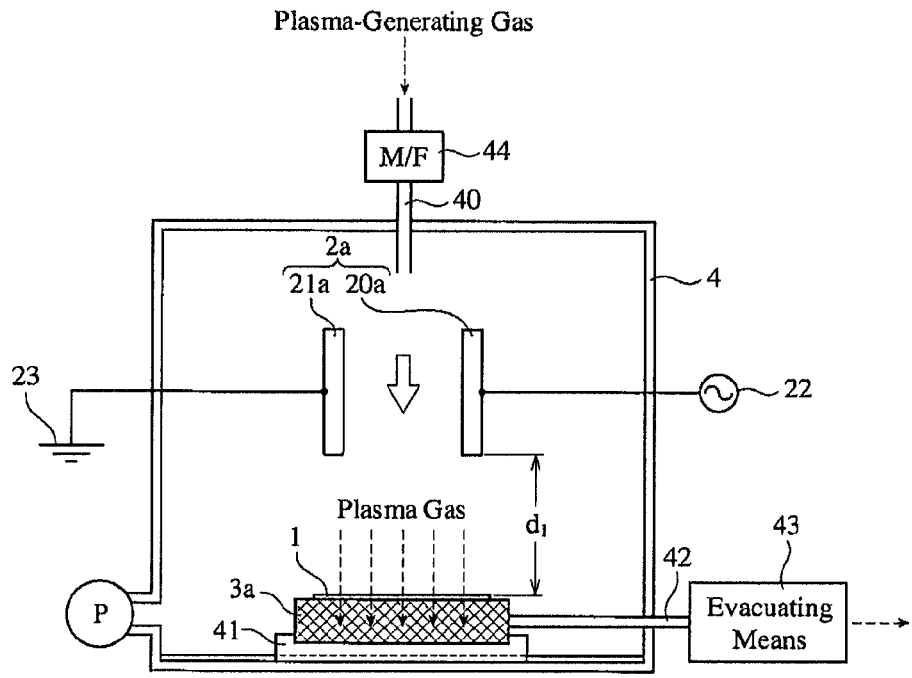
FIG. 1 is a schematic view showing one example of apparatuses for plasma-treating a porous body.

The materials of a porous body, to which the plasma-treating method of this invention can be applied, include plastics, glass, ceramics, metals, semiconductors, etc. Through not critical, the porous body is preferably in the form of a film or a plate. The preferred porous body is a porous plastic film, which includes a microporous membrane, a non-woven fabric, etc. of thermoplastic resins. Thermoplastic resins forming the microporous membrane and the non-woven fabric include polyolefins (for instance, polyethylene, polypropylene, etc.), polyesters, polyamides, polyarylene ether, polyarylene sulfide, etc. Among them, the polyolefins are preferable.

Microporous polyolefin membranes are produced, for instance, by the method disclosed by Japanese Patent 2132327. The method of Japanese Patent 2132327 can produce a microporous polyethylene membrane by (i) melt-blending a polyethylene composition comprising ultra-high-molecular-weight polyethylene and high-density polyethylene with a membrane-forming solvent to prepare a polyethylene solution, (ii) extruding the polyethylene solution from a die lip and cooling the resultant extrudate to provide a gel-like sheet, (iii) stretching the gel-like sheet, (iv) removing the membrane-forming solvent from the stretched sheet with a washing solvent, and (v) drying the resultant membrane. The microporous polyethylene membrane thus produced usually has an average pore size of 0.005 to 1 μm, a porosity of 25 to 95%, air permeability (JIS P8117) of 50 to 10,000 seconds/100 ml (converted to the value at a thickness of 25 μm), and a thickness of 5 to 200 μm.

[2] Plasma-Treating Method and Apparatus

The method of this invention comprising (a) blowing a plasma gas to a porous body at a flow rate of 0.002 to 2 L/minute/cm$^2$ per a unit area of the porous body, (b) sucking the porous body in a plasma gas atmosphere, or (c) sucking the porous body while blowing a plasma gas at the above flow rate to the porous body, thereby plasma-treating the surfaces and pores of the porous body.

Though not critical, plasma is preferably generated by glow discharge between a set of a high-voltage electrode and a ground electrode in a plasma-generating gas atmosphere (glow discharge method). The porous body can be plasma-treated in a plasma-gas-generating region between both electrodes (direct method), or outside the plasma-gas-generating region (indirect method). The plasma treatment can be conducted by a batch or continuous operation.

The plasma gas can be blown onto the porous body at the above flow rate, by supplying a plasma-generating gas from a high-pressure tank to a plasma-gas-generating means comprising high-voltage electrode and a ground electrode, and ejecting a plasma gas from the plasma-gas-generating means. The plasma gas generated in the generating means is preferably blown through a nozzle, a blower, etc.

In both direct and indirect methods, the plasma treatment can be conducted under atmospheric or reduced pressure. In the case of plasma treatment under reduced pressure, pressure in the system is preferably 1 to 100 Pa.

The plasma-generating gas can be properly selected depending on the material of the porous body, as long as an inert gas is indispensable. The plasma-generating gas can be not only an inert gas, but also a mixed gas of an inert gas and a reactive gas. The inert gas includes He, Ne, Ar, Xe, Kr, etc., and the reactive gas includes $O_2$, $H_2$, $N_2$, etc. These gases can be used alone or in proper combination. When the porous body is a microporous polyolefin membrane, the plasma-generating gas is preferably an inert gas such as He, Ar or a mixture thereof, or a mixed gas of He, Ar or a mixture thereof with $O_2$, $H_2$ or a mixture thereof. Taking the plasma treatment of a film-shaped, porous body for example, explanation will be made in detail below referring to the drawings.

(1) First Apparatus

FIG. 1 shows an example of the first plasma-treating apparatus of this invention. In this batch-type apparatus, a film-shaped, porous body 1 is plasma-treated by indirect method. This apparatus comprises (a) a plasma-gas-generating means 2a comprising a planar, high-voltage electrode 20a and a planar ground electrode 21a opposing each other in a chamber 4, (b) a pipe 40 for supplying a plasma-generating gas to the generating means 2a, (c) a vacuum pump P for evacuating the chamber 4, (d) a parallel movable table 41 mounted on a bottom of the chamber 4, (e) a planar, porous support 3a having pores communicating in both thickness and plane directions, which is placed on the table 41, and (f) an evacuating means 43 connected to the porous support 3a via a pipe 42. The planar, high-voltage electrode 20a is connected to a high-frequency power supply 22, and the planar ground electrode 21a is connected to the ground 23.

The film-shaped, porous body 1 is fixed on the porous support 3a, and the plasma-generating gas is supplied to the generating means 2a at a flow rate controlled by a mass flow controller (M/F) 44 to apply high-frequency voltage between both electrodes 20a, 21a to generate glow discharge plasma. Because the film-shaped, porous body 1 is fixed on the porous support 3a at a position of receiving pressure from a plasma gas flow, the generated plasma gas can pass through the film-shaped, porous body 1, so that the entire surfaces and pores of the film-shaped, porous body 1 can be plasma-treated. The film-shaped, porous body 1 can be fixed on the porous support 3a by a frame plate, clips, etc.

The plasma-generating apparatus 2a preferably has output of 100 to 30,000 W and a frequency of 10 kHz to 500 MHz. When the film-shaped, porous body 1 is a microporous polyolefin membrane, the flow rate of the plasma gas blown to a unit area can be 0.002 to 2 L/minute/$cm^2$ to sufficiently treat the pores with plasma. This flow rate is preferably 0.02 to 1.2 L/minute/$cm^2$. When the film-shaped, porous body 1 is a microporous polyolefin membrane, the pressure of the plasma gas flow blown is preferably 1 to 100 Pa, more preferably 5 to 50 Pa. The pressure of the plasma gas flow is measured by a pressure sensor in the plasma gas flow. The distance $d_1$ from a plasma-gas-blowing opening to an upper surface of the film-shaped, porous body 1 is preferably 0.1 to 10 mm.

The porous support 3a is preferably sucked by the evacuating means 43, to increase the amount of the plasma gas passing through the film-shaped, porous body 1, thereby achieving an efficient plasma treatment of the film-shaped, porous body 1. The evacuating means 43 can be an aspirator, a vacuum pump, a blower, etc. The suction pressure can be properly set depending on the porosity, etc. of the film-shaped, porous body 1. When the film-shaped, porous body 1 is a microporous polyolefin membrane, the suction pressure is preferably 1 to 100 Pa, more preferably 5 to 50 Pa. The suction pressure is measured by a pressure sensor attached to the pipe 42. The amount of the plasma gas passing through the film-shaped, porous body 1 is preferably 0.002 to 2 L/minute/$cm^2$, more preferably 0.02 to 1.2 L/minute/$cm^2$, per a unit area of the film-shaped, porous body 1. The amount of the passing plasma gas is measured by a wet-type gas meter disposed downstream of the evacuating means 43. In the depicted example, the porous support 3a is sucked on the side, but sucking can be done from a lower surface of the porous support 3a. When the porous body 1 is a block shape, a lower or side surface of the porous body 1 can be directly sucked.

Materials for the porous support 3a are not particularly restricted, but can be metals such as aluminum, ceramics, plastics, etc. The porous support 3a preferably has a porosity of 20 to 80%. When the porosity is less than 20%, it takes long time for the plasma gas to pass through the film-shaped, porous body 1. When the porosity is more than 80%, the porous support 3a has a small contact area with the film-shaped, porous body 1, failing to support the film-shaped, porous body 1 stably. This porosity is more preferably 30 to 60%. The size and shape of the porous support 3a can be properly set depending on the size, etc. of the film-shaped, porous body 1 to be treated with plasma.

The table 41 for supporting the porous support 3a is preferably movable in parallel, such that the horizontal moving film-shaped, porous body 1 can be uniformly treated with plasma. When the film-shaped, porous body 1 is a microporous polyolefin membrane, the moving speed of the table 41 is preferably 1 to 2,000 mm/second. The table 41 can be moved in parallel, for instance, by a linear actuator, etc.

Figure 2:
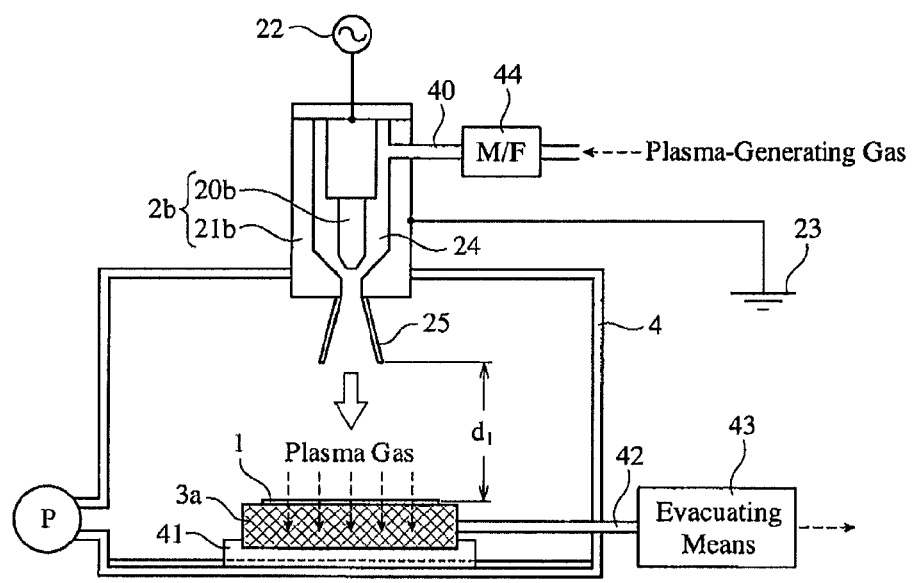
FIG. 2 is a schematic view showing another example of apparatuses for plasma-treating a porous body.

FIG. 2 shows another example of the first plasma-treating apparatus of this invention. This batch-type apparatus also treats the film-shaped, porous body 1 with plasma by indirect method. This apparatus is the same as the apparatus shown in FIG. 1, except that the former comprises a plasma-gas-generating means 2b at an upper position of the chamber 4 in place of the plasma-generating apparatus 2a, the plasma-gas-generating means 2b comprising a high-voltage, columnar electrode 20b connected to a high-frequency power supply 22, and a cylindrical ground electrode 21b disposed around the plasma-gas-generating means 2b via a gas path 24 acting as a discharge gap. An inner surface of the cylindrical ground electrode 21b is usually provided with an insulating layer (not shown). A pipe 40 for introducing a plasma-generating gas penetrates the cylindrical ground electrode 21b to communicate with the gas path 24. There is a nozzle 25 provided at an end of the gas path 24 near a tip end of the electrode 20b.

With the film-shaped, porous body 1 fixed on the porous support 3a, the plasma-generating gas is introduced into the gas path 24 while applying high-frequency voltage between both electrodes 20b, 21b, so that the resultant plasma gas is ejected from the nozzle 25. The output and frequency of this plasma-gas-generating means 2b can be the same as those of the plasma gas apparatus 2a shown in FIG. 1. The flow rate and pressure of the plasma gas blown to the film-shaped, porous body 1, and the porosity of the porous support 3a can be the same as described above. In this apparatus, too, the porous support 3a is preferably sucked by the evacuating means 43. The suction pressure and the amount of the plasma gas passing through the film-shaped, porous body 1 can be the same as described above.

Figure 3:
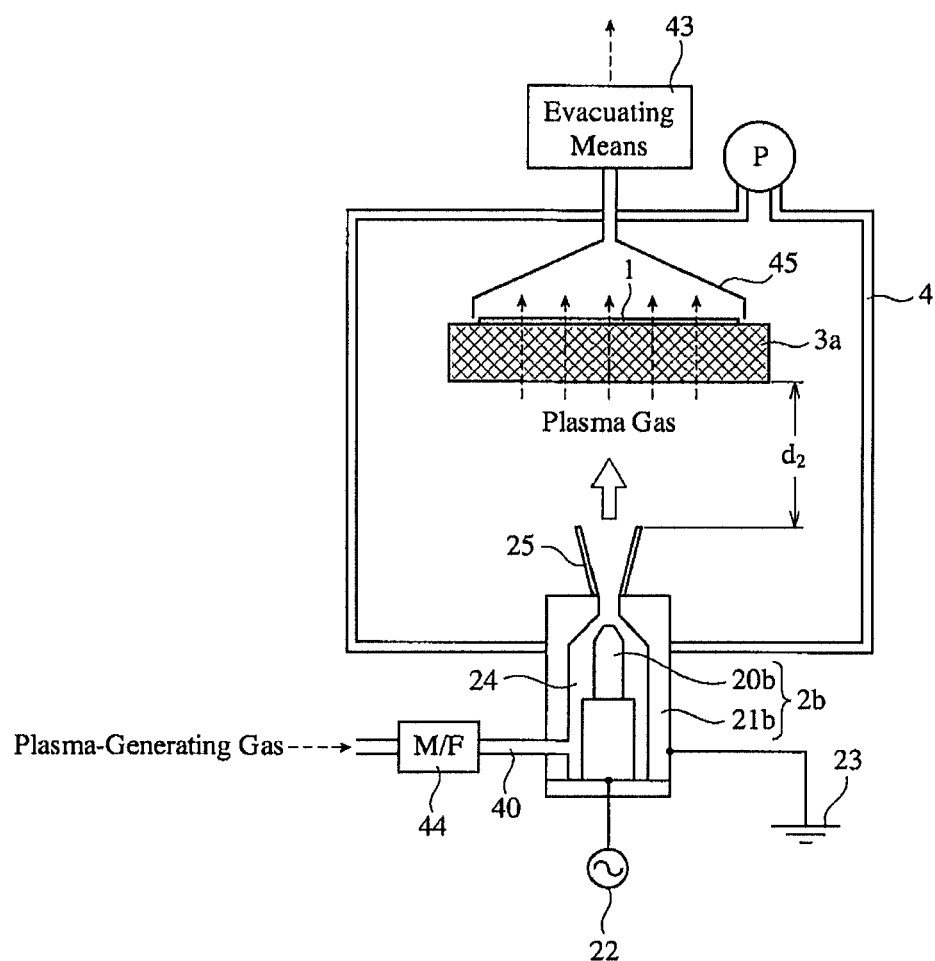
FIG. 3 is a schematic view showing a further example of apparatuses for plasma-treating a porous body.

FIG. 3 shows a further example of the first plasma-treating apparatus of this invention. This batch-type apparatus also treats a film-shaped, porous body 1 with plasma by indirect method. This apparatus comprises a plasma-gas-generating means 2b at a bottom of the chamber 4, and a porous support 3a disposed substantially at a position opposing the plasma-gas-generating means 2b.

With the film-shaped, porous body 1 fixed on the porous support 3a, a plasma gas flow is blown to a lower surface of the porous support 3a, while sucking the film-shaped, porous body 1 from above by an evacuating means 43 through a hood 45, so that the plasma gas can pass through the film-shaped, porous body 1. The flow rate and pressure of the plasma gas blown to the porous support 3a, and the suction pressure and amount of the plasma gas passing through the film-shaped, porous body 1 can be the same as described above. The porosity of the porous support 3a can be the same as described above. The film-shaped, porous body 1 is preferably fixed to the porous support 3a with tension, such that the film-shaped, porous body 1 can be treated in a complete contact with the porous support 3a. The distance $d_2$ from a plasma-gas-blowing opening to a lower surface of the porous support 3a is preferably 0.1 to 10 mm.

Figure 4:
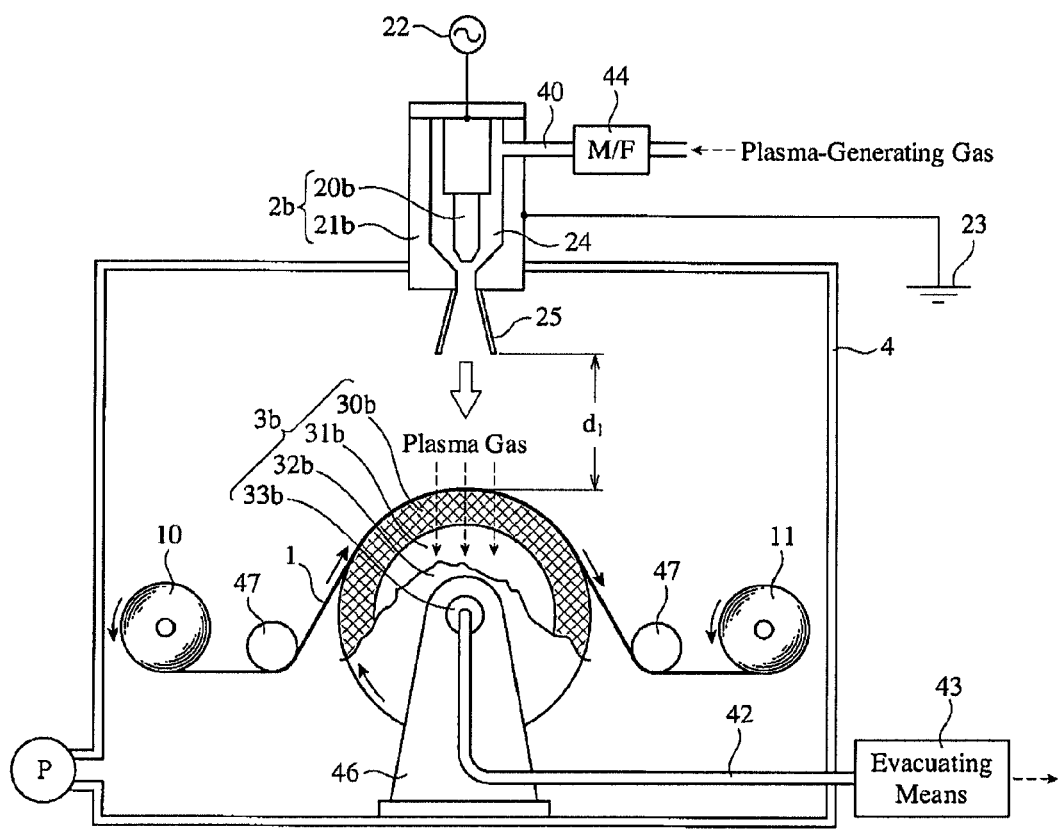
FIG. 4 is a schematic view showing a still further example of apparatuses for plasma-treating a porous body.

FIG. 4 shows a still further example of the first plasma-treating apparatus of this invention. This continuous apparatus also treats a film-shaped, porous body 1 with plasma by indirect method. This apparatus comprises a porous roll 3b for conveying a film-shaped, porous body 1 substantially at a position opposing a plasma-gas-generating means 2b. A film-shaped, porous body 1 unwound from a reel 10 passes a guide roll 47, is blown with a plasma gas at the above flow rate while being conveyed by the porous roll 3b, passes a guide roll 47, and then is wound around a reel 11. The plasma gas can pass through the film-shaped, porous body 1 on the porous roll 3b.

The porous roll 3b preferably has a suction function. The porous suction roll 3b comprises (i) a porous cylindrical body (porous support) 30b having an evacuatable inner space 31b and large numbers of pores in a circumferential wall for communicating with the space 31b, (ii) a pair of side plates 32b attached to both ends of the cylindrical body 30b, at least one of which has a penetrating hole communicating with the space 31b, and (iii) a pair of bearings 33b having a penetrating hole communicating with the penetrating hole of the side plate 32b. The bearing 33b comprises a bearing (not shown) for rotatably supporting the cylindrical body 30b. The bearing 33b of the porous suction roll 3b is supported by a bracket 46. The space 31b is evacuated by suction by the evacuating means 43 communicating through the penetrating hole of the bearing 33b and the pipe 42, so that the porous roll 3b rotated by a motor (not shown) can suck the film-shaped, porous body 1 attached to its peripheral surface. The porous suction roll 3b preferably has a diameter of 15 to 60 cm.

The conveying speed by the porous suction roll 3b is preferably 1 to 2,000 mm/second, more preferably 2 to 1,000 mm/second. The flow rate and pressure of a plasma gas blown to the film-shaped, porous body 1 on the porous suction roll 3b, the suction pressure, and the amount of the plasma gas passing through the film-shaped, porous body 1 can be the same as described above. The porosity of the porous suction roll 3b can be the same as described above.

Figure 5:
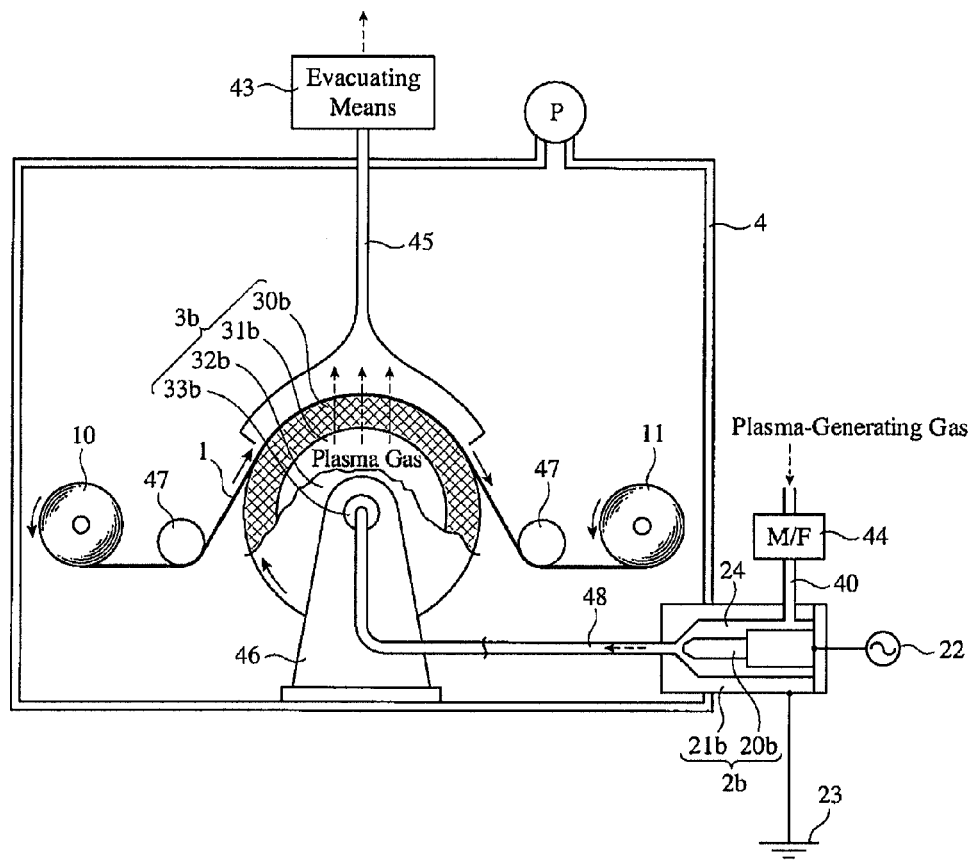
FIG. 5 is a schematic view showing a still further example of apparatuses for plasma-treating a porous body.

FIG. 5 shows a still further example of the first plasma-treating apparatus of this invention. This continuous apparatus also treats a film-shaped, porous body 1 with plasma by indirect method. In this apparatus, a plasma-gas-generating means 2b is communicating with a space 31b of a porous roll 3b via a pipe 48, a penetrating hole of a bearing 33b and a penetrating hole of a side plate 32b, such that a plasma gas is supplied to the porous roll 3b, from which it is ejected.

When the plasma gas is supplied from the generating means 2b to the film-shaped, porous body 1 conveyed by the porous roll 3b while sucking the film-shaped, porous body 1 from above by the evacuating means 43 via a hood 45, the plasma gas can pass through the film-shaped, porous body 1. The speed of conveying by the porous roll 3b, the amount of the plasma gas passing through the film-shaped, porous body 1, and the suction pressure can be the same as described above. The contact pressure of the film-shaped, porous body 1 with the porous roll 3b is properly controlled, such that film-shaped, porous body 1 is conveyed in contact with the porous roll 3b.

(2) Second Apparatus

Figure 6:
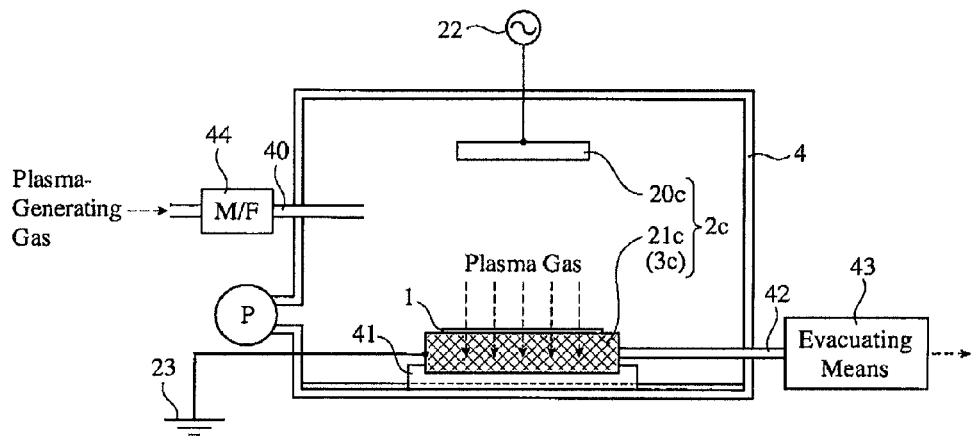
FIG. 6 is a schematic view showing a still further example of apparatuses for plasma-treating a porous body.

FIG. 6 shows an example of the second plasma-treating apparatus of this invention. This batch-type apparatus treats a film-shaped, porous body 1 with plasma by direct method. This apparatus comprises a plasma-gas-generating means 2c having a planar, porous ground electrode 21c, which acts as a support for the film-shaped, porous body 1.

When the film-shaped, porous body 1 to be treated is insulating, the porous ground electrode 21c (porous support 3c) is preferably composed of a porous metal covered with a porous dielectric body. The porous dielectric body can be a porous plastic (for instance, a foamed polyurethane sheet, a porous silicone rubber, etc.), a porous ceramic, etc. When the film-shaped, porous body 1 to be treated is conductive, the porous ground electrode 21c (porous support 3c) is preferably composed of a porous metal. The porosity of the porous support 3c can be the same as described above.

With the film-shaped, porous body 1 fixed on the porous ground electrode 21c (porous support 3c), high-frequency voltage is applied between electrodes 20c, 21c in a plasma-generating gas atmosphere, and the porous ground electrode 21c is sucked by the evacuating means 43, so that the film-shaped, porous body 1 can be treated in a plasma-gas-generating, and that the resultant plasma gas can pass through the film-shaped, porous body 1. The suction pressure, the amount of the plasma gas passing through the film-shaped, porous body 1, and the output and frequency of the plasma-gas-generating means 2c can be the same as described above.

Figure 7:
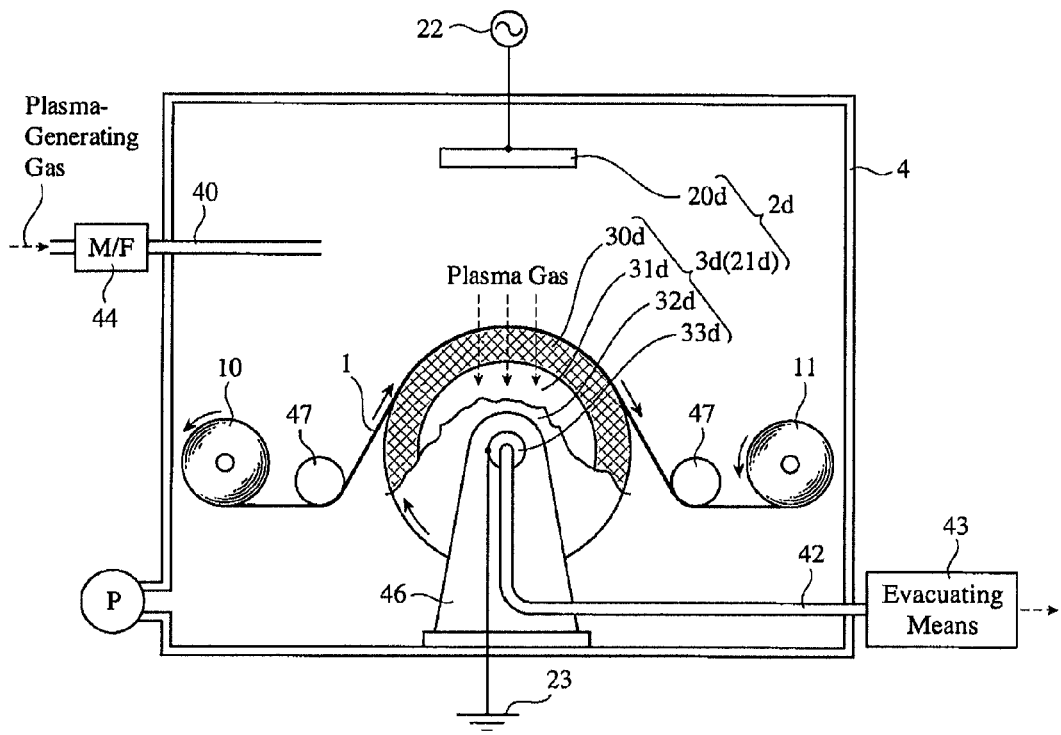
FIG. 7 is a schematic view showing a still further example of apparatuses for plasma-treating a porous body.

FIG. 7 shows another example of the second plasma-treating apparatus of this invention. This continuous apparatus also treats the film-shaped, porous body 1 with plasma by direct method. A plasma-gas-generating means 2d in this apparatus comprises a planar, high-voltage electrode 20d, and a ground electrode 21d constituted by a porous metal suction roll 3d. The porous metal suction roll 3d is substantially opposing the planar, high-voltage electrode 20d in a chamber 4. The structure per se of the porous metal suction roll 3d (cylindrical body 30d, space 31d, side plate 32d and bearing 33d) can be that of the porous roll 3b shown in FIG. 4. As described above, when the film-shaped, porous body 1 to be treated is insulating, the porous metal suction roll 3d is covered with a porous dielectric body.

The film-shaped, porous body 1 unwound from the reel 10 is treated with a plasma gas passing therethrough in a plasma-gas-generating region while being conveyed by the porous metal suction roll 3d (ground electrode 21d), and wound around a reel 11. The speed of conveying by the porous metal suction roll 3d can be the same as described above. The amount of the plasma gas passing through the film-shaped, porous body 1, the porosity of the porous metal suction roll 3d, and the suction pressure can be the same as described above.

(3) Third Apparatus

Figure 8:
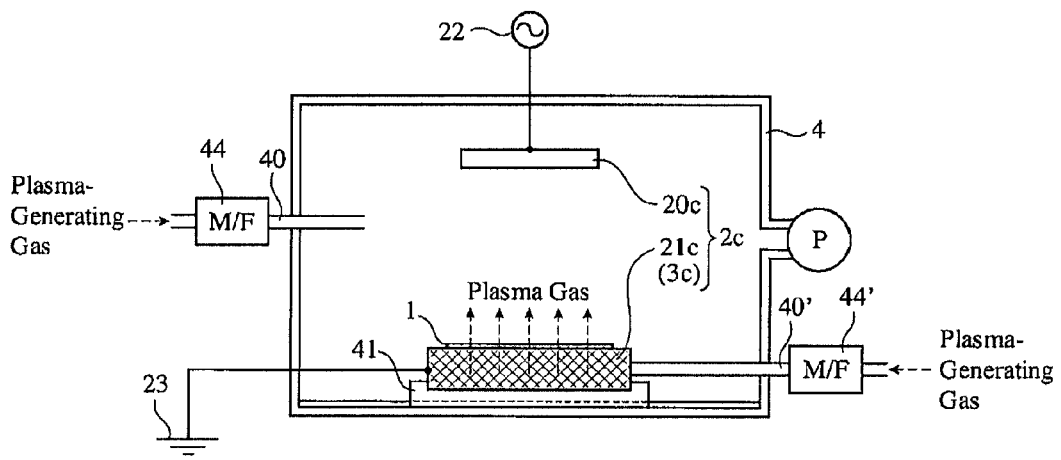
FIG. 8 is a schematic view showing a still further example of apparatuses for plasma-treating a porous body.

FIG. 8 shows an example of the third plasma-treating apparatus of this invention. This batch-type apparatus also treats a film-shaped, porous body 1 with plasma by direct method. This apparatus can be the same as shown in FIG. 6, except for comprising a mass flow controller 44' in place of the evacuating means 43. With the film-shaped, porous body 1 fixed on the porous ground electrode 21c (porous support 3c), a plasma-generating gas is supplied between electrodes 20c, 21c via a mass flow controller 44, and a plasma-generating gas is supplied to the porous ground electrode 21c via a mass flow controller 44', while high-frequency voltage is applied between the electrodes 20c, 21c. The generated plasma gas can pass through the film-shaped, porous body 1. Suction is preferably conducted by a vacuum pump P substantially opposing the pipe 40. The flow rate of the plasma gas blown to the film-shaped, porous body 1 can be the same as described above. The flow rates of the plasma-generating gases supplied from the pipes 40 and 40' can be properly set. Although the depicted apparatus comprises the mass flow controller 44 and the vacuum pump P, either one of them can be omitted. When the vacuum pump P is omitted, a drainpipe is disposed.

Figure 9:
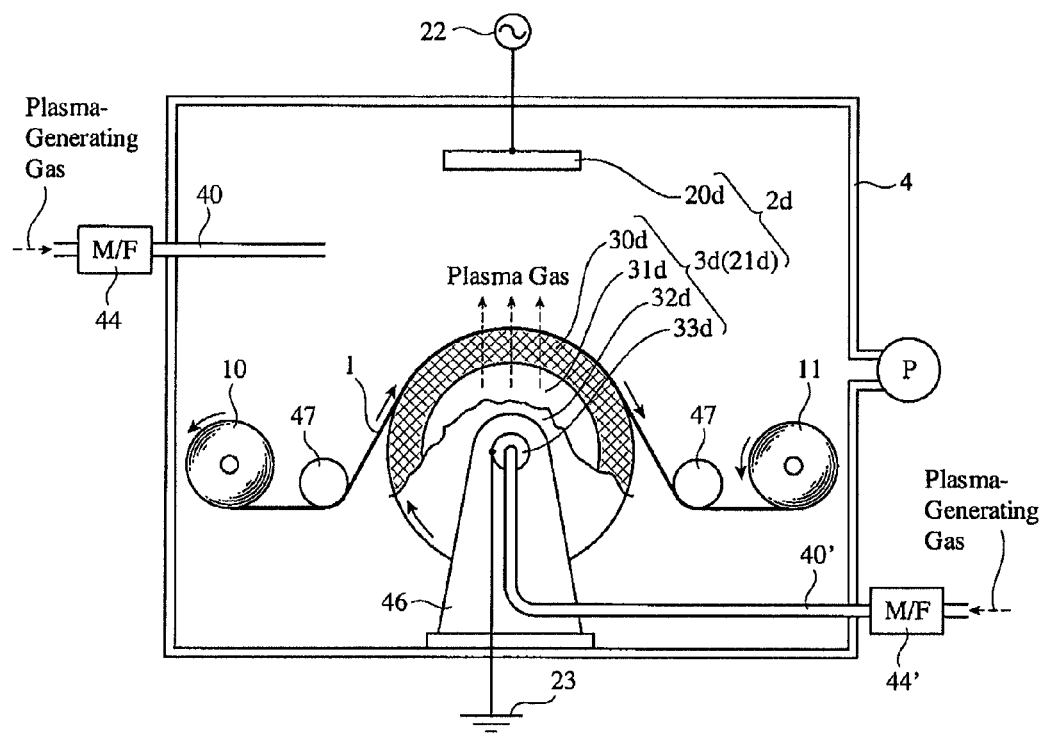
FIG. 9 is a schematic view showing a still further example of apparatuses for plasma-treating a porous body.

FIG. 9 shows another example of the third plasma-treating apparatus of this invention. This continuous apparatus also treats a film-shaped, porous body 1 with plasma by direct method. This apparatus is the same as shown in FIG. 7 except for comprising a mass flow controller 44' in place of the evacuating means 43. With the film-shaped, porous body 1 conveyed by a porous metal roll 3d (ground electrode 21d), a plasma-generating gas is supplied between electrodes 20d, 21d via a mass flow controller 44, and a plasma-generating gas is supplied to the porous metal roll 3d via a mass flow controller 44', while high-frequency voltage is applied between the electrodes 20d, 21d. The generated plasma gas can pass through the film-shaped, porous body 1. Suction is preferably conducted by a vacuum pump P opposing the pipe 40. The amount of the plasma gas blown to the film-shaped, porous body 1 can be the same as described above. The flow rates of the plasma-generating gases supplied from the pipes 40 and 40' can be properly set. Although the depicted apparatus comprises the mass flow controller 44 and the vacuum pump P, either one of them can be omitted. When the vacuum pump P is omitted, a drain pipe is disposed.

(4) Fourth Apparatus

Figure 10:
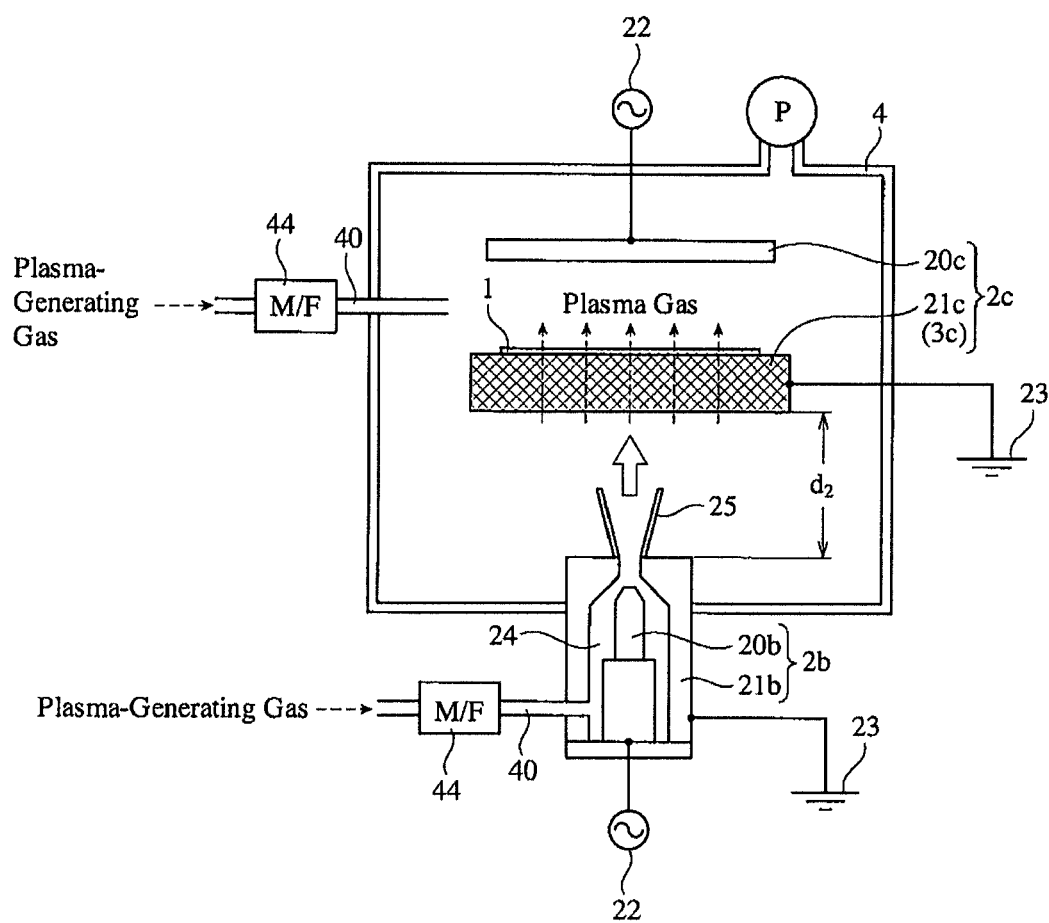
FIG. 10 is a schematic view showing a still further example of apparatuses for plasma-treating a porous body.

FIG. 10 shows an example of the fourth plasma-treating apparatus of this invention. This batch-type apparatus also treats a film-shaped, porous body 1 with plasma by direct method. This apparatus comprises a first plasma-generating apparatus 2c constituted by a set of a planar, high-voltage electrode 20c and a planar porous ground electrode 21c (porous support 3c), and a second plasma-generating apparatus 2b disposed at a bottom of a chamber 4.

In this apparatus, the film-shaped, porous body 1 in contact with the porous support 3c is treated not only with plasma between a set of a planar, high-voltage electrode 20c and a planar porous ground electrode 21c (porous support 3c) in a plasma-gas-generating region, but also with the plasma gas blown from the generating means 2b to the porous support 3c from below and passing through the film-shaped, porous body 1. Plasma treatment is preferably conducted while sucking by a vacuum pump P disposed at a ceiling of the chamber 4. The amount of the plasma gas blown to the film-shaped, porous body 1, and the material and porosity of the porous ground electrode 21c can be the same as described above.

Figure 11:
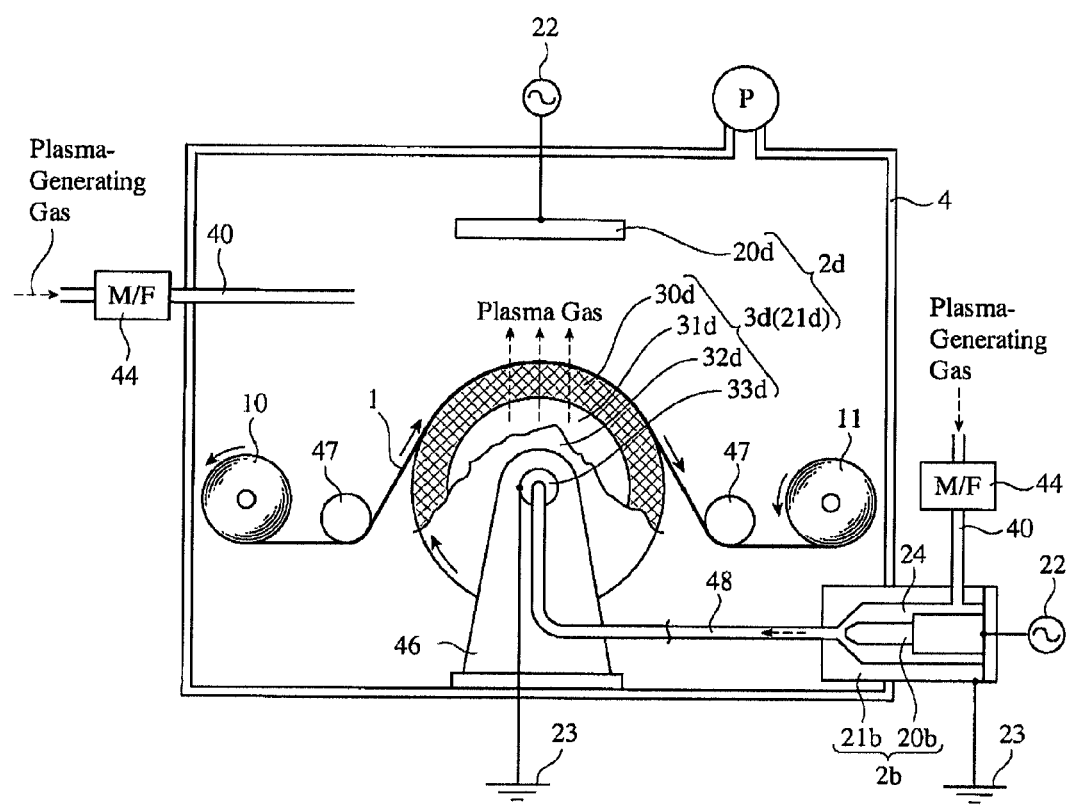
FIG. 11 is a schematic view showing a still further example of apparatuses for plasma-treating a porous body.

FIG. 11 shows another example of the fourth plasma-treating apparatus of this invention. This continuous apparatus also treats a film-shaped, porous body 1 with plasma by direct method. This apparatus comprises a first plasma-gas-generating means 2d having a planar, high-voltage electrode 20d and a ground electrode 21d (porous metal roll 3d), and a second plasma-generating apparatus 2b for supplying a plasma gas to a space 31d of a porous metal roll 3d.

In this apparatus, the film-shaped, porous body 1 conveyed by the porous metal roll 3d is treated between the planar, high-voltage electrode 20d and the porous metal roll 3d in a plasma-gas-generating region, while a plasma gas ejecting from the roll 3d is caused to pass through the film-shaped, porous body 1. Suction is preferably conducted by a vacuum pump P disposed at a ceiling of a chamber 4. The conveying speed by the roll 3d, and the amount of the plasma gas blown to the film-shaped, porous body 1 can be the same as described above.

The above plasma treatment covers the surfaces and pores of the porous body 1. When the microporous polyolefin membrane is treated, oxygen-containing functional groups such as a carboxyl group, a carbonyl group, etc. can be introduced into the membrane, improving its hydrophilicity. Particularly the microporous polyolefin membrane plasma-treated according to this invention is useful for battery separators, various filters, various functional material carriers, etc.

[3] Monomer-Grafting Treatment

A plasma-treated, porous plastic body 1 can be grafted with a monomer to improve its hydrophilicity. When the porous body 1 is a microporous polyolefin membrane, the monomer is preferably an acrylic monomer. The monomer grafting of a plasma-treated microporous polyolefin membrane can be conducted by the method described in JP 9-31226 A, in which the plasma-treated microporous polyolefin membrane is graft-polymerized with an acrylic monomer such as methacrylate. Such monomer grafting provides the microporous polyolefin membrane with improved hydrophilicity and affinity for various organic solvents. Accordingly, microporous polyolefin membranes plasma-treated and monomer-grafted according to this invention exhibit excellent properties, when used for battery separators, various filters, various functional material carriers, etc.

This invention has been explained above referring to the drawings without intention of restricting thereto, and various modifications can be made unless they are deviated from the scope of this invention.

This invention will be explained in more detail with reference to Examples below without intention of restricting the scope of this invention.

EXAMPLE 1

Using the batch-type apparatus shown in FIG. 1, a microporous polyethylene membrane (SETELA available from Tonen Chemical Corporation) of 5 cm×5 cm×30 μm having a porosity of 63% and air permeability of 80 seconds/100 ml (Gurey value) was plasma-treated under an atmospheric pressure as follows. The microporous polyethylene membrane 1 was fixed on a porous support 3a constituted by an aluminum block comprising an upper porous surface having a porosity of 50%, which was placed on a table 41 on a bottom surface of the chamber 4, and a high-frequency voltage of 13.56 MHz and 500 W was applied between a high-voltage electrode 20a and a ground electrode 21a while supplying helium between them at a flow rate of 3,000 ml/minute. The resultant plasma gas (3 L/minute) was supplied to the microporous polyethylene membrane 1 from above by 1 mm. While suction was conducted at a pressure of 28 Pa by an aspirator 43 connected to a porous portion of the support 3a such that the amount of a plasma gas passing through the microporous membrane 1 was 3 L/minute, the table 41 was moved at a speed of 3 mm/sec.

The measurement of the atmospheric-pressure-plasma-treated microporous polyethylene membrane 1 on both surfaces by a contact angle meter (Drop Master 100 available from Kyowa Interface Science Co. Ltd.) revealed that the contact angle of pure water (simply called "water contact angle") was 32° on the upper surface (on the side of the plasma-generating apparatus 2a), and 48° on the lower surface (on the side of the porous support 3a). The FT-IR measurement of both surfaces of the plasma-treated microporous polyethylene membrane 1 confirmed that a carboxylic acid group was mainly introduced into both surfaces, indicating that even the lower surface was effectively plasma-treated.

EXAMPLE 2

A microporous polyethylene membrane was plasma-treated at an atmospheric pressure in the same manner as in Example 1, except that the microporous polyethylene membrane was not sucked. The measurement of the resultant microporous polyethylene membrane on both surfaces revealed that the water contact angle was 30° on the upper surface and 80° on the lower surface. The FT-IR measurement of both surfaces of the plasma-treated microporous polyethylene membrane confirmed that a carboxylic acid group was mainly introduced into both surfaces, indicating that even the lower surface was effectively plasma-treated.

COMPARATIVE EXAMPLE 1

A microporous polyethylene membrane was plasma-treated at an atmospheric pressure in the same manner as in Example 1, except that a non-porous aluminum block was used as the support, and that the microporous polyethylene membrane was not sucked. The measurement of the resultant microporous polyethylene membrane on both surfaces revealed that the water contact angle was 36° on the upper surface, but 123° on the lower surface. The FT-IR measurement of both surfaces of the plasma-treated microporous polyethylene membrane confirmed that although a carboxylic acid group was mainly introduced into the upper surface, there were no peaks corresponding to chemical species other than polyethylene on the lower surface, indicating that the plasma treatment did not proceed to the lower surface.

COMPARATIVE EXAMPLE 2

A microporous polyethylene membrane was plasma-treated at an atmospheric pressure in the same manner as in Example 1, except that a mixed gas of helium (flow rate: 3,000 ml/minute) and oxygen (flow rate: 10 ml/minute) was used as the plasma-generating gas, that a non-porous aluminum block was used as the support, and that the microporous polyethylene membrane was not sucked. The measurement of the resultant microporous polyethylene membrane on both surfaces revealed that the water contact angle was 52° on the upper surface, but 127° on the lower surface. The FT-IR measurement of both surfaces of the plasma-treated microporous polyethylene membrane confirmed that although a carboxylic acid group was mainly introduced into the upper surface, there were no peaks corresponding to chemical species other than polyethylene on the lower surface, indicating that the plasma treatment did not proceed to the lower surface.

COMPARATIVE EXAMPLE 3

A microporous polyethylene membrane was plasma-treated at an atmospheric pressure in the same manner as in Example 1, except that a mixed gas of helium (flow rate: 2,500 ml/minute) and argon (flow rate: 500 ml/minute) was used as the plasma-generating gas, that a non-porous aluminum block was used as the support, and that the microporous polyethylene membrane was not sucked. The measurement of the resultant microporous polyethylene membrane on both surfaces revealed that the water contact angle was 30° on the upper surface, but 129° on the lower surface. The FT-IR measurement of both surfaces of the plasma-treated microporous polyethylene membrane confirmed that although a carboxylic acid group was mainly introduced into the upper surface, there were no peaks corresponding to chemical species other than polyethylene on the lower surface, indicating that the plasma treatment did not proceed to the lower surface.

EXAMPLE 3

Using the batch-type apparatus shown in FIG. 6, a microporous polyethylene membrane was plasma-treated at an atmospheric pressure using a support 3c obtained by entirely covering an upper surface of the same porous support (aluminum block having an upper porous surface having a porosity of 50%) as in Example 1 with a foamed polyurethane sheet. The same microporous polyethylene membrane 1 as in Example 1 was fixed on the covered upper surface of the porous support 3c. The porous support 3c was placed on a table 41 on a bottom of the apparatus, such that the porous support 3c acted as a ground electrode 21c. While supplying helium at a flow rate of 3,000 ml/minute between the high-voltage electrode 20c and the microporous polyethylene membrane 1, a high-frequency voltage of 13.56 MHz and 500 W was applied between the high-voltage electrode 20c and the ground electrode 21c (support 3c) to generate a plasma gas. While suction was conducted at a pressure of 28 Pa by an aspirator 43 connected to a porous portion of the support 3a such that the amount of a plasma gas passing through the microporous membrane 1 was 3 L/minute, the table 41 was moved at a speed of 3 mm/sec.

The measurement of the atmospheric-pressure-plasma-treated microporous polyethylene membrane 1 on both surfaces revealed that the water contact angle was 29° on the upper surface and 37° on the lower surface. The FT-IR measurement of both surfaces of the plasma-treated microporous polyethylene membrane confirmed that a carboxylic acid group was mainly introduced into both surfaces, indicating that even the lower surface was effectively plasma-treated.

EXAMPLE 4

The atmospheric-pressure-plasma-treated microporous polyethylene membrane obtained in Example 3 was immediately immersed in a solution of 1% by volume of methacrylate in water/methanol at a volume ratio of 50:50 at a temperature of 50° C. for 30 minutes, and then washed with water. The FT-IR measurement of the dried microporous polyethylene membrane confirmed that polymethyl acrylate was formed by graft polymerization. Calculated from the mass increase of the microporous polyethylene membrane, the amount of methacrylate grafted was 11% by mass. The measurement of the grafted microporous polyethylene membrane on both surfaces revealed that the water contact angle was 25° on the upper surface and 28° on the lower surface.

COMPARATIVE EXAMPLE 4

A microporous polyethylene membrane was plasma-treated at an atmospheric pressure in the same manner as in Example 3, except that a non-porous aluminum block was used as the support, and that the microporous polyethylene membrane was not sucked. The measurement of the resultant microporous polyethylene membrane on both surfaces revealed that the water contact angle was 31° on the upper surface and 114° on the lower surface. The FT-IR measurement of both surfaces of the plasma-treated microporous polyethylene membrane confirmed that although a carboxylic acid group was mainly introduced into the upper surface, there were no peaks corresponding to chemical species other than polyethylene on the lower surface, indicating that the plasma treatment did not proceed to the lower surface.

EFFECT OF THE INVENTION

According to this invention, the porous body can be efficiently plasma-treated not only on surfaces but also in pores. This invention is particularly effective for plasma-treating a microporous polyolefin membrane having a large surface area and a pore size of several μm or less. The microporous polyolefin membrane plasma-treated by the method of this invention is hydrophilized in both surfaces and pores, suitable for battery separators, various filters, various functional material carriers, etc.

What is claimed is:

1. An apparatus for plasma-treating a porous body in a chamber, comprising
 (i) a plasma-gas-generating means, wherein the plasma-gas-generating means comprises a high-voltage electrode and a ground electrode, each of which are located on the same side of a porous body contained in a chamber;
 (ii) a pipe for supplying a plasma-generating gas, which is an inert gas or a mixed gas of an inert gas and a reactive gas, to the generating means, and
 (iii) a porous support contained in the chamber, the porous support being disposed at such a position that it receives pressure from a plasma gas flow supplied from the generating means, and the pressure of the plasma gas flow being applied to the porous body or the porous support in contact with the porous body.

2. The plasma-treating apparatus according to claim 1, which further comprises a means for sucking the porous body or the porous support, the porous body or the porous support being sucked in a state where the porous body is in contact with the porous support.

\* \* \* \* \*